(12) United States Patent
Kim et al.

(10) Patent No.: US 10,396,309 B2
(45) Date of Patent: Aug. 27, 2019

(54) DISPLAY DEVICE AND FABRICATING METHOD THEREOF

(71) Applicants: LG Display Co., Ltd., Seoul (KR); Industry-Academic Cooperation Foundation, Yonsei University, Seoul (KR)

(72) Inventors: Ho-Jin Kim, Goyang-si (KR); ChoongKeun Yoo, Gimpo-si (KR); YongBaek Lee, Seoul (KR); Hyungjun Kim, Seoul (KR); Il-Kwon Oh, Seoul (KR); Seunggi Seo, Seoul (KR)

(73) Assignees: LG DISPLAY CO., LTD., Seoul (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/365,229

(22) Filed: Nov. 30, 2016

(65) Prior Publication Data

US 2017/0155088 A1    Jun. 1, 2017

(30) Foreign Application Priority Data

Nov. 30, 2015   (KR) .................... 10-2015-0168701

(51) Int. Cl.
  *H01L 51/52*   (2006.01)
  *H01L 27/32*   (2006.01)
(52) U.S. Cl.
  CPC ...... *H01L 51/5253* (2013.01); *H01L 27/3244* (2013.01); *H01L 27/3248* (2013.01); *H01L 27/3276* (2013.01); *H01L 2227/323* (2013.01)
(58) Field of Classification Search
  CPC ............. H01L 51/5253; H01L 27/3244; H01L 27/3248; H01L 2227/323
  See application file for complete search history.

(56) References Cited

U.S. PATENT DOCUMENTS 7,030,001 B2    4/2006  Adetutu et al.
2003/0205845 A1   11/2003  Pichler et al.
(Continued)

FOREIGN PATENT DOCUMENTS

KR   10-2007-0014152 A   1/2007
KR   10-2014-0074740 A   6/2014
(Continued)

OTHER PUBLICATIONS

Hoffmann et al., "Gas Permeation Barriers Deposited by Atmospheric Pressure Plasma Enhanced Atomic Layer Deposition," J. Vac. Sci. Technol. A, vol. 34, No. 1, Jan./Feb. 2016 (originally published Nov. 9, 2015), 5 pages.
(Continued)

*Primary Examiner* — Phat X Cao
(74) *Attorney, Agent, or Firm* — Birch, Stewart, Kolasch & Birch, LLP

(57) ABSTRACT

Discussed is a display device and a fabricating method thereof according to an embodiment, in which an organic-inorganic composite film is patterned without a mask by using an anti-film layer, and a residual anti-film layer protects a pad portion. The display device comprises a lower substrate; pixels arranged on a display area of the lower substrate; pads arranged on a non-display area of the lower substrate; an encapsulation layer arranged on the pixels; and an anti-film layer arranged on the pads as a molecular layer having a thickness of a single molecule. Also, the fabricating method of the display device comprises the steps of forming pads on a non-display area of a lower substrate and forming pixels on a display area; and forming an anti-film layer on the pixels as a molecular layer having a thickness of a single molecule.

15 Claims, 8 Drawing Sheets

(56) References Cited

U.S. PATENT DOCUMENTS

| | | | |
|---|---|---|---|
| 2004/0072380 A1 | 4/2004 | Yamazaki et al. | |
| 2010/0237337 A1* | 9/2010 | Kamura | H01L 51/052 257/40 |
| 2011/0140114 A1* | 6/2011 | Ko | H01L 27/3244 257/59 |
| 2012/0208306 A1 | 8/2012 | Haas et al. | |
| 2013/0270528 A1 | 10/2013 | Lee et al. | |
| 2013/0312827 A1* | 11/2013 | Adachi | H01L 31/022425 136/256 |
| 2014/0160695 A1* | 6/2014 | Jeong | H05K 3/305 361/749 |
| 2015/0249137 A1 | 9/2015 | Katsuhara et al. | |
| 2017/0294394 A1* | 10/2017 | Suzuki | H01L 24/29 |

FOREIGN PATENT DOCUMENTS

| | | |
|---|---|---|
| KR | 10-2015-0021212 A | 3/2015 |
| KR | 10-2015-0078347 A | 7/2015 |

OTHER PUBLICATIONS

Woo et al., "Alumina/Polymer-Coated Nanocrystals with Extremely High Stability Used as a Color Conversion Material in LEDs," Nanotechnology, vol. 24, Nov. 27, 2013, pp. 1-9.

* cited by examiner

DISPLAY DEVICE AND FABRICATING METHOD THEREOF

CROSS REFERENCE TO THE RELATED APPLICATIONS

This application claims the priority benefit of the Korean Patent Application No. 10-2015-0168701, filed on Nov. 30, 2015, which is hereby incorporated by reference for all purposes as if fully set forth herein.

BACKGROUND OF THE INVENTION

Field of the Invention

The present invention relates to a display device and a fabricating method thereof.

Discussion of the Related Art

With the advancement of an information society, a demand for a display device for displaying an image has increased in various forms. Recently, various flat panel display devices such as a liquid crystal display (LCD), a plasma display panel (PDP), and an organic light emitting display device have been used.

The display device includes a display panel and a data driver. The display panel includes a display area and a non-display area. The display area includes data lines, gate lines, and a plurality of pixels formed at crossing portions between the data lines and the gate lines and supplied with data voltages of the data lines when gate signals are supplied to the gate lines. The pixels emit light with a predetermined brightness in accordance with the data voltages, and an encapsulation layer for protecting the pixels from oxygen and water may be formed above the display area. The non-display area is formed in the periphery of the display area.

The data driver may include a plurality of source drive integrated circuits (hereinafter, referred to as "ICs"). Each of the source drive ICs may be fabricated of a driving chip. Each of the source drive ICs may be packaged in a flexible film. Each of source flexible films may be embodied in a tape carrier package or chip on film (COF), and may be bent or curved.

Each of the flexible films may be attached to pads formed on the non-display area by using an anisotropic conductive film (ACF). Since the pads are electrically connected with the data lines, the source drive ICs may be connected with the data lines.

Meanwhile, when the anisotropic conductive film is attached to the pads, the anisotropic conductive film cannot be attached to the pads if the encapsulation layer is formed on the pads. Therefore, the encapsulation layer is formed on a light emitting layer only using a mask, and is patterned so as not to be formed on the pads.

Alternatively, if the mask is not used, after an etching protection layer (EPL) is formed on an area except the area where the pads are formed, the pads may be opened through dry-etching, or may be opened by laser ablation for the area where the pads are formed.

It takes additional cost as the mask process is increased if the mask is used. And it takes additional cost for forming the etching protection layer even when the mask is not used.

SUMMARY OF THE INVENTION

Accordingly, the present invention is directed to a display device and a fabricating method thereof, which substantially obviate one or more problems due to limitations and disadvantages of the related art.

An advantage of the present invention is to provide a display device and a fabricating method thereof, in which an organic-inorganic composite film is patterned without a mask by using an anti-film layer, whereby the cost may be reduced.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device according to the embodiment of the present invention comprises a lower substrate; pixels arranged on a display area of the lower substrate; pads arranged on a non-display area of the lower substrate; an encapsulation layer arranged on the pixels; and an anti-film layer arranged on the pads as a molecular layer.

In another aspect of the present invention, a fabricating method of a display device according to the embodiment of the present invention comprises the steps of forming pads on a non-display area of a lower substrate and forming pixels on a display area; and forming an anti-film layer on the pixels as a molecular layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
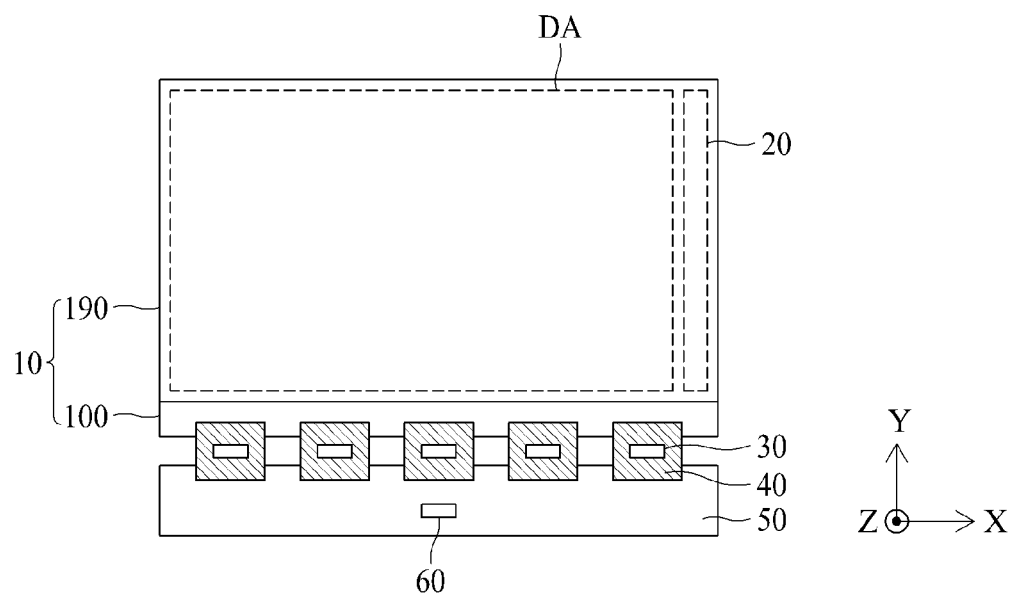
FIG. 1 is a plane view illustrating a display panel, a gate driver, a source drive IC, a flexible film, a circuit board and a timing controller of a display device according to an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is defined by the scope of the claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. Therefore, a first element could be termed a second element, and, similarly, a second element could be termed a first element, without departing from the scope of the present invention.

"X-axis direction", "Y-axis direction" and "Z-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the embodiments of the present invention will be described in detail with reference to the accompanying drawings.

Hereinafter, a display device according to an embodiment of the present invention will be described in detail with reference to FIGS. 1 to 7. For convenience of description in FIGS. 1 to 7, X-axis direction indicates a direction parallel with a gate line, Y-axis indicates a direction parallel with a data line, and Z-axis indicates a height direction of the display device.

Although the display device according to the embodiment of the present invention has been described based on an organic light emitting display device, the display device may be realized as a liquid crystal display device or an electrophoresis display device.

Referring to FIG. 1, the display device according to the embodiment of the present invention includes a display panel 10, a gate driver 20, a source drive integrated circuit (hereinafter, referred to as "IC") 30, a flexible film 40, a circuit board 50, and a timing controller 60.

The display panel 10 includes a lower substrate 100 and an upper substrate 190. The lower substrate 100 serves as a support substrate. The upper substrate 190 serves as an encapsulation substrate.

The display panel 10 transmits incident light or displays an image. Gate lines and data lines may be formed on a display area DA of the display panel 10, and pixels may be formed on crossing areas where the gate lines cross the data lines. The pixels of the display area DA may display an image.

The gate driver 20 supplies gate signals to the gate lines in accordance with a gate control signal input from the timing controller 60. In FIG. 1, the gate driver 20 is formed, but not limited to, outside one side of the display area DA of the display panel 10 in a gate driver in panel (GIP) mode. That is, the gate driver 20 may be formed outside both sides of the display area DA of the display panel 10 in a GIP mode, or may be fabricated of a driving chip, packaged in a flexible film and attached to the display panel 10 in a tape automated bonding (TAB) mode.

The source drive IC 30 receives digital video data and a source control signal from the timing controller 60. The source drive IC 30 converts the digital video data to analog data voltages in accordance with the source control signal and supplies the analog data voltages to the data lines. If the source drive IC 30 is fabricated of a driving chip, the source drive IC 30 may be packaged in the flexible film 40 in a chip on film (COF) or chip on plastic (COP) mode.

Pads such as data pads are provided in a part of the lower substrate 100. Lines which connect the pads with the source drive IC 30 and lines which connect the pads with lines of the circuit board 50 may be formed in the flexible film 40. The flexible film 40 is attached on the pads by using an anisotropic conductive film, whereby the pads may be connected with the lines of the flexible film 40.

The circuit board 50 may be attached to the flexible films 40. A plurality of circuits comprised of driving chips may be packaged in the circuit board 50. For example, the timing controller 60 may be packaged in the circuit board 50. The circuit board 50 may be a printed circuit board or a flexible printed circuit board.

The timing controller 60 receives digital video data and a timing signal from an external system board (not shown). The timing controller 60 generates a gate control signal for controlling an operation timing of the gate driver 20 and a source control signal for controlling the source drive ICs 30 on the basis of the timing signal. The timing controller 60 supplies the gate control signal to the gate driver 20, and supplies the source control signal to the source drive ICs 30.

Embodiment 1

Hereinafter, a display device according to the first embodiment of the present invention will be described with reference to FIGS. 2 to 5.

Figure 2:
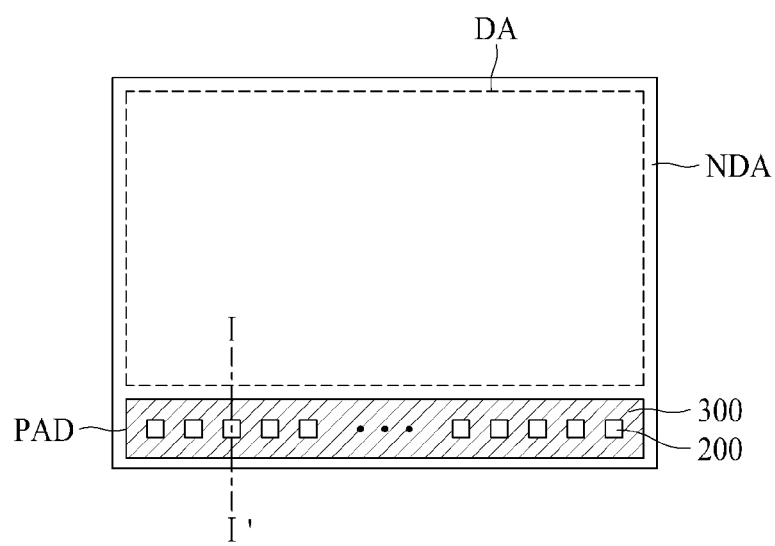
FIG. 2 is a plane view illustrating an encapsulation layer, pads and an anti-film layer of a display device according to a first embodiment of the present invention.

FIG. 2 is a front view illustrating a display device according to the first embodiment of the present invention. In FIG. 2, a display area DA, a non-display area NDA, a pad area PAD, pads 200, and an anti-film layer 300 are shown.

The display area DA indicates an area where an image is displayed. Pixels are formed on the display area DA. A detailed description of the pixels will be described later with reference to FIG. 3.

The non-display area NDA is formed outside the display area DA. The non-display area NDA may include pads 200 for supplying a gate voltage and a data voltage to the pixels arranged within the display area DA.

The pad area PAD where the pads 200 are formed is formed on a part of the non-display area NDA. In FIG. 2, the pad area PAD is formed below the non-display area NDA. The pads 200 are formed on the pad area PAD of the lower substrate 100. The pads 200 shown in FIG. 2 supply a data voltage to the display area DA.

The anti-film layer 300 is formed on the pads 200. In the display device according to the first embodiment of the present invention, the anti-film layer 300 may be formed above the pads 200 and on the pad area PAD. Further, the anti-film layer 300 may be arranged above all of the pads 200. The anti-film layer 300 may prevent an inorganic protection film or an inorganic-organic composite film from being formed on the pads 200.

The inorganic protection film or the inorganic-organic composite film is formed to protect the device from an external environment, especially water and oxygen. However, the pads 200 which should be electrically connected with an external circuit should be maintained in a state that the inorganic protection film or the inorganic-organic composite film is not formed, that is, should be opened.

Although a mask has been conventionally used to open the inorganic protection film or the inorganic-organic composite film, the anti-film layer 300 may be used instead of the mask in the present invention such that the inorganic protection film or the inorganic-organic composite film may not be formed above the pads 200.

Therefore, the pads 200 may be fabricated to be electrically connected with each other even in a device in which a mask is not used, among inorganic film devices, and the pads 200 may be fabricated to be electrically connected with each other without a mask even in a device in which a mask may be used, whereby the mask cost and management cost may be reduced.

Figure 3:
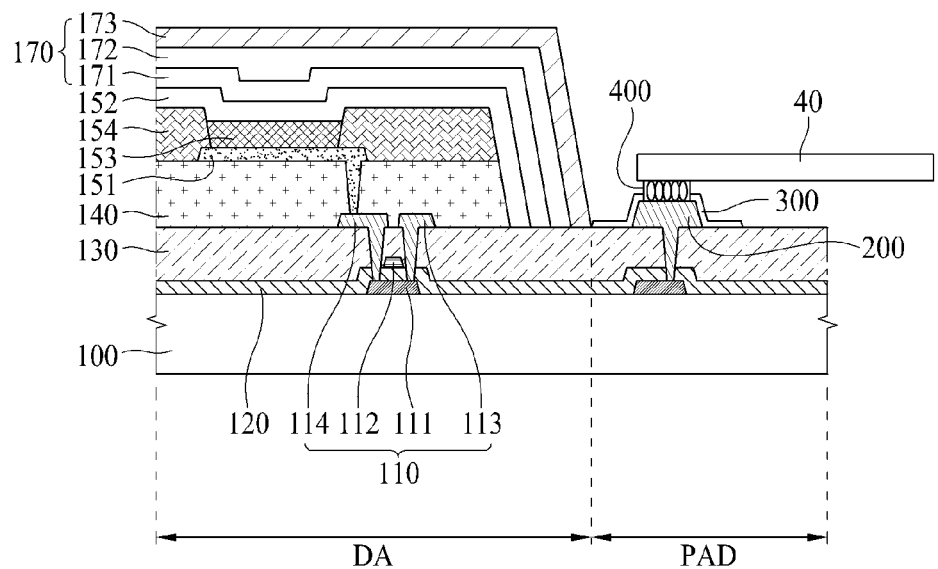
FIG. 3 is a cross-sectional view taken along line I-I' of FIG. 2.

FIG. 3 is a cross-sectional view illustrating a display device according to the first embodiment of the present invention. FIG. 3 illustrates a cross-sectional view taken along line I-I' of FIG. 2. Although the display device according to the first embodiment of the present invention has been described based on an organic light emitting display device in FIG. 3, the display device may be realized as a liquid crystal display device or an electrophoresis display device. A part of the display area DA and the pad area PAD are shown in FIG. 3.

Pixels P are formed on the display area DA. A cross-section of one of the pixels P is shown in FIG. 3. As shown in FIG. 3, the pixel P indicates an area that includes an anode electrode 151 exposed between banks 154, an organic light emitting layer 153 provided on the anode electrode 151, and a thin film transistor 110 of which drain electrode 114 is connected with the anode electrode 151. Each of the thin film transistors 110 includes a semiconductor layer 111, a gate electrode 112, a source electrode 113, and a drain electrode 114.

The semiconductor layers 111 are provided on the lower substrate 100. A buffer film may be provided between the lower substrate 100 and the semiconductor layers 111. An inter layer dielectric 120 may be provided on the semiconductor layers 111. A gate electrode 112 may be provided on the inter layer dielectric 120. A gate insulating film 130 may be provided on the gate electrodes 112. The source electrodes 113 and the drain electrodes 114 may be provided on the gate insulating film 130. Each of the source electrodes 113 and the drain electrodes 114 may be connected to the semiconductor layer 111 through a contact hole that passes through the inter layer dielectric 120 and the gate insulating film 130.

A planarization film 140 is provided on the thin film transistor 110 to arrange the pixels P, which are partitioned by banks 154, with planarization.

Anode electrodes 151, organic light emitting layers 153, a cathode electrode 152, and the banks 154 are provided on the planarization film 140. The anode electrodes 151 and the organic light emitting layers 153 may be provided on the display area DA, and the cathode electrode 152 and the banks 154 may be provided on the display area DA and the non-display area NDA.

Each of the anode electrodes 151 is connected to the drain electrode 114 through a contact hole that passes through the planarization film 140.

The organic light emitting layers 153 are provided on the anode electrodes 151 exposed between the banks 154 on the display area DA. Since each of the banks 154 is higher than each of the organic light emitting layers 153, the organic light emitting layers 153 are partitioned by the banks 154. That is, each of the organic light emitting layers 153 is arranged between the banks 154.

The cathode electrode 152 is provided on the organic light emitting layers 153 and the banks 154 in the display area DA to cover the organic light emitting layers 153 and the banks 154.

An encapsulation layer 170 is provided on the cathode electrode 152. The encapsulation layer 170 serves to prevent oxygen or water from being permeated into the organic light emitting layers 153 and the cathode electrode 152. The encapsulation layer 170 includes a first inorganic film 171, an organic film 172, and a second inorganic film 173.

The first inorganic film 171 is provided on the cathode electrode 152 to cover the cathode electrode 152. The organic film 172 is provided on the first inorganic film 171 to prevent water and oxygen from being permeated into the organic light emitting layer 153 and the cathode electrode 152 by passing through the first inorganic film 171. The second inorganic film 173 is provided on the organic film 172 to cover the organic film 172.

Each of the first and second inorganic films 171 and 173 may be formed of silicon nitride, aluminum nitride, titanium nitride, silicon oxide, aluminum oxide or titanium oxide. For example, each of the first and second inorganic films 171 and 173 may be formed SiNx, SiO$_2$, Al$_2$O$_3$, or TiO$_2$.

Figure 4:
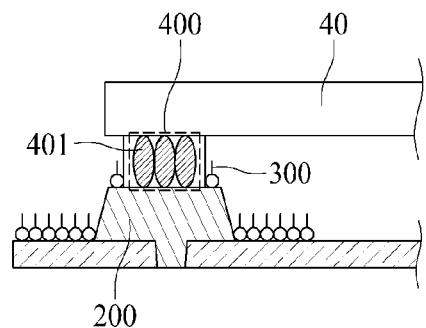
FIG. 4 is an enlarged view illustrating pads, an anti-film material, an anisotropic conductive film and a flexible film according to an embodiment of the present invention.

FIG. 4 is an enlarged view illustrating pads 200, an anti-film material 300, an anisotropic conductive film ACF 400 and a flexible film 40 according to one embodiment of the present invention.

The pads 200 are provided on a part of the lower substrate 100. The pads 200 may be gate pads supplying the gate control signal to the gate driver, data pads supplying the data voltage to the data lines, or power pads supplying a power voltage to a power line. The pads 200 are arranged on the pad area PAD of the lower substrate 100 as shown in FIGS. 3 and 4. The pads 200 may be arranged on the gate insulating film 130 formed on the lower substrate 100. The pads 200 may be arranged to be connected with a conductive line formed on the lower substrate 100 by passing through the gate insulating film 130.

The anti-film material 310 is a material for forming the anti-film layer 300. The anti-film material 310 is arranged above the pads 200 and the pad area PAD. The anti-film material 310 may be a self-assembled monolayer (SAM) of which molecules are self-aligned in accordance with affinity of its adjacent material. In this case, the anti-film layer 300 may have a thickness the same as a length of one molecule of the anti-film material 310.

The anisotropic conductive film ACF 400 may allow the flexible film 40 to be connected with the pad 200. The anisotropic conductive film ACF 400 may have a plurality of conductive balls 401 having great electric conductivity. The conductive ball 401 may be formed between the anti-film materials 310 or may be formed to pass through the anti-film layer 300. Therefore, the pad 200 may electrically be connected with the flexible film 40 through the conductive ball 401 even in the case that the anti-film layer 300 is formed.

The flexible film 40 is attached onto the pads 200 by using the anisotropic conductive film ACF 400. The lines connecting the pads 200 with the source drive IC and the lines connecting the pads 200 with the lines of the circuit board may be formed in the flexible film 40. The pads 200 may be connected with the source drive IC or the circuit board through the lines formed in the flexible film 40. Alternatively, the flexible film 40 may package the source drive IC in a chip on film (COF) mode.

Figure 5:
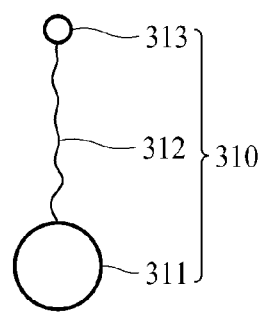
FIG. 5 is a structural view illustrating a molecule of an anti-film material of FIG. 4.

FIG. 5 is a structural view illustrating a molecule of an anti-film material 310 according to one embodiment of the present invention. The anti-film material 310 includes a head part 311, a chain 312, and a tail part 313.

The head part 311 is bonded to an upper surface of the pads 200. The head part 311 is made of thiol, silane, or phosphonic acid, which may easily be bonded to a conductive metal formed on the upper surface of the pads 200.

The chain 312 is extended from one side of the head part 311. The chain 312 is made of hydrocarbon as a main material. If a reaction of hydrocarbon that forms the chain 312 is controlled to adjust a length of the chain 312, a length of the anti-film layer 310 may be adjusted. The anti-film layer 300 is a molecular layer having a thickness of a single molecule. Since the anti-film layer 300 forms a layer using one of molecules of the anti-film material 310, the length of the chain 312 may be adjusted to adjust the thickness of the anti-film layer 300.

The tail part 313 is connected to an end at one side of the chain 312. The tail part 313 is formed at an opposite side of the head part 311 to prevent the first inorganic film 171, the organic film 172 and the second inorganic film 173 from being formed on the pads 200. To this end, the tail part 313 is made of methyl which is not reacted with the first inorganic film 171, the organic film 172 and the second inorganic film 173.

In the display device according to the first embodiment of the present invention, the anti-film layer 300 is formed on the pads 200, whereby the encapsulation layer 170 is not formed. For this reason, a separate mask for removing the encapsulation layer 170 formed on the pads 200 may not be used. Therefore, the mask cost and the cost for performing a patterning process using a mask may be reduced.

Also, in the display device according to the first embodiment of the present invention, the anti-film layer 300 remains on the pads 200. For this reason, water and oxygen may be prevented from being permeated into the pads 200 during the process.

Embodiment 2

Figure 6A:
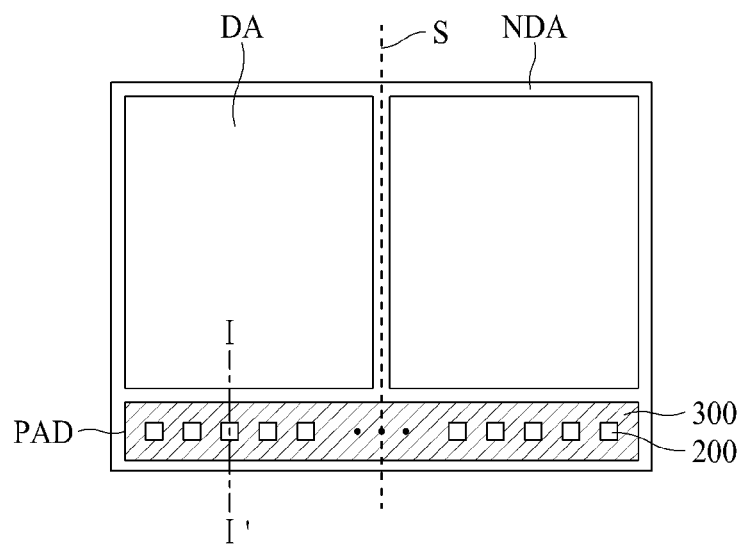
FIGS. 6A and 6B are plane views illustrating an encapsulation layer, pads and an anti-film layer prior to cutting of a display device according to a second embodiment of the present invention.
Figure 6B:
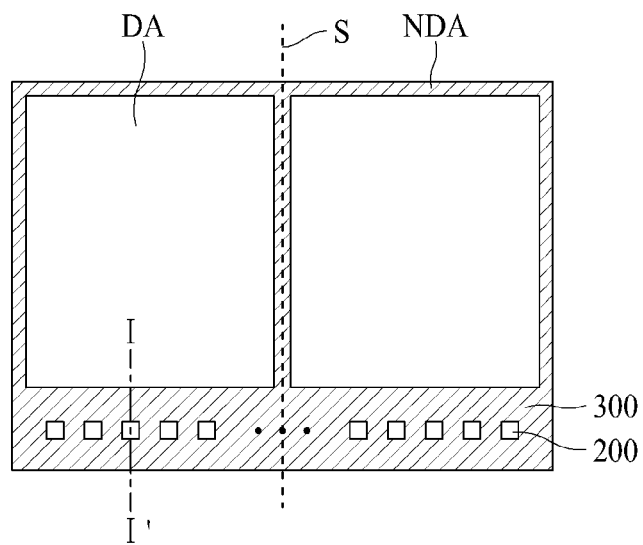

Hereinafter, a display device according to the second embodiment of the present invention will be described with reference to FIGS. 6A and 6B. A display area DA, a non-display area NDA, a pad area PAD, pads 200, and an anti-film layer 300 are shown in FIGS. 6A and 6B. Pixels are formed on the display area DA of the display device according to the second embodiment of the present invention. Since the display area DA, the pixels, the non-display area NDA, the pad area PAD, and the pads 200 according to the second embodiment of the present invention are the same as those of the display device according to the first embodiment of the present invention, their detailed description will be omitted.

The anti-film layer 300 according to the second embodiment of the present invention may be arranged to cover the non-display area NDA without being formed to be limited to the pad area PAD of the pads 200. Further, the anti-film layer 300 may be arranged to cover the whole non-display area NDA. In this case, the first inorganic film 171, the organic film 172, and the second inorganic film 173 are formed in the display area DA only. Therefore, the encapsulation layer 170 is formed separately per display panel 10.

Since the anti-film layer 300 is not formed on the non-display area NDA in the conventional display device unlike FIG. 6A, the encapsulation layer 170 is uniformly arranged on a plurality of display panels 10. Therefore, after the encapsulation layer 170 is arranged, the encapsulation layer 170 is cut during a scribing (S) process for cutting per display panel 10. In this case, the deposition structure of the first inorganic film 171, the organic film 172 and the second inorganic film 173, which are formed at the edge of each display panel 10 and constitute the encapsulation layer 170, may be distorted, or the encapsulation layer 170 may be peeled away. Oxygen and water may be permeated into the display panel 10, in which the deposition structure of the encapsulation layer 170 is distorted or peeled away, through the edge of the display panel 10.

On the contrary, in the display device according to the second embodiment of the present invention, since the anti-film layer 300 is formed on the entire non-display area NDA, the encapsulation layer 170 is not formed on the non-display area NDA. That is, the encapsulation layer 170 is formed separately per display panel 10, and is not formed on the cross-section where the scribing (S) is performed as shown in FIG. 6B. Therefore, the deposition structure of the first inorganic film 171, the organic film 172 and the second inorganic film 173, which are arranged within the encapsulation layer 170 formed on the display panel 10, may be neither distorted nor peeled away, whereby oxygen and water are not permeated into the edge of the display panel 10.

Since the elements and action of the anti-film layer 300 according to the second embodiment of the present invention are the same as those of the anti-film layer 300 according to the first embodiment of the present invention, their detailed description will be omitted.

Figure 7:
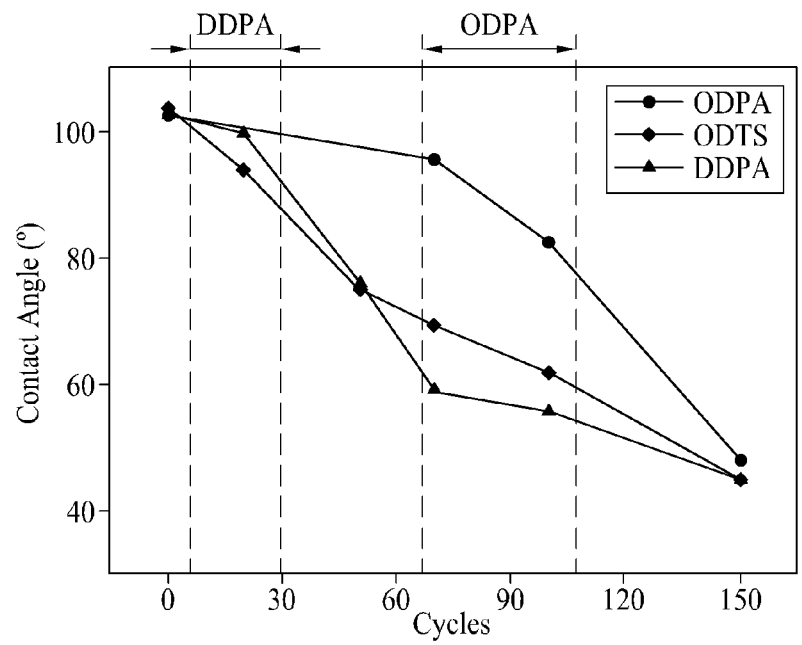
FIG. 7 is a graph illustrating the principle and effect of an anti-film layer of a display device according to an embodiment of the present invention.

The principle and effect of the anti-film layer 300 according to the embodiment of the present invention may be noted through a resultant graph of FIG. 7.

FIG. 7 is a resultant graph of an experiment that measures a contact angle to measure anti-film property of aluminum oxide ($Al_2O_3$). It is noted that aluminum oxide is deposited on the surface of the anti-film layer 300 if the contact angle becomes small. The contact angle becomes small if a process cycle is continued. On the contrary, an anti-film prevention effect is continued if the contact angle becomes great. According to the result of the experiment, ODPA (Oxydiphthalic Anhydride) of which the head part 311 is phosphonic acid has an anti-film prevention effect superior to that of ODTS (Octadecyltrichlorosilane) of which the head part is silane. Also, ODPA of which the chain 312 is formed of 18 carbon atoms has an anti-film prevention effect superior to that of DDPA (Dimethy-diphenylphosphinamide) of which the chain 312 is formed of 12 carbon atoms.

[Fabricating Method]

Hereinafter, a fabricating method of a display device according to one embodiment of the present invention will be described with reference to FIGS. 12 and 13A to 13D.

Figure 13A:
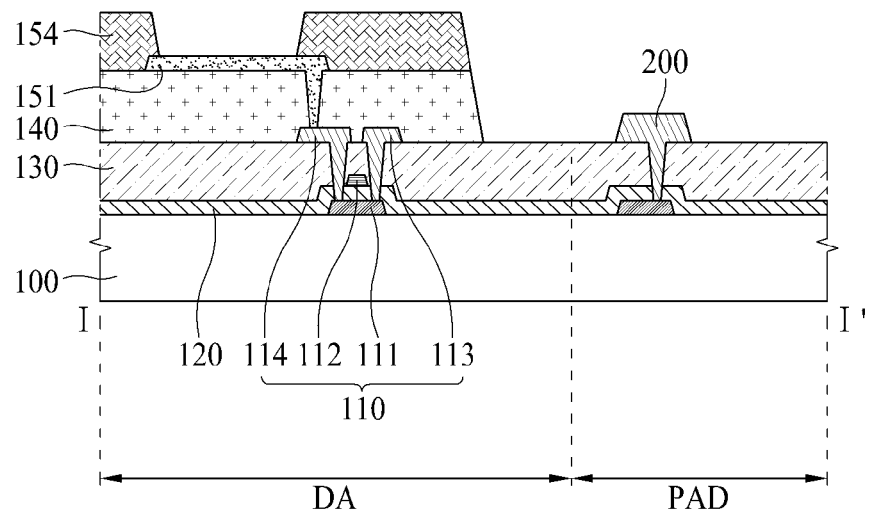
FIGS. 13A to 13D are cross-sectional views illustrating a fabricating method of a display device according to an embodiment of the present invention.

First of all, the pads 200 are formed on the non-display area NDA of the lower substrate 100. As shown in FIG. 13A, the thin film transistors 110, the inter layer dielectric 120 and the gate insulating film 130 may be formed on the lower substrate 100 before the pads 200 are formed on the non-display area NDA. The anode electrodes 151 and the banks 154 may be formed on the thin film transistor (TFT) 110 before, after or at the same time when the pads 200 are formed. (S101 of FIG. 12)

Figure 13B:
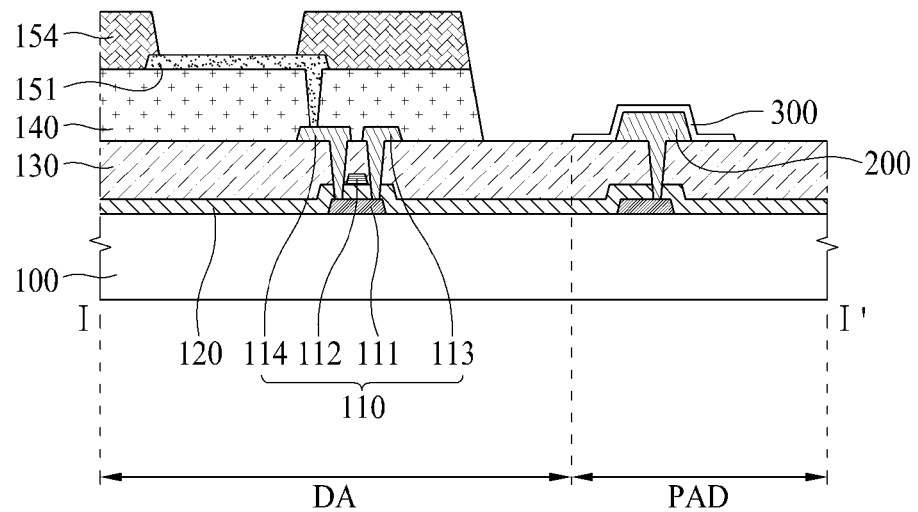

Secondly, as shown in FIG. 13B, the anti-film layer 300 is formed on the pads 200 as a molecular layer having a thickness of a single molecule. To form the anti-film layer 300, the anti-film material 310 may be dipped on the pad area PAD or stamped on the pads 200. Afterwards, the anti-film material 310 may be dried.

To fabricate the display device according to the first embodiment of the present invention, the anti-film material 310 may be dipped on the pad area PAD or stamped on the pads 200 such that the anti-film layer 300 may only be formed above the pads and on the pad area PAD. (S102 of FIG. 12)

To fabricate the display device according to the second embodiment of the present invention, the anti-film material 310 may be sprayed onto the entire non-display area NDA, whereby the anti-film layer 300 may be formed to cover the non-display area NDA. That is, since the anti-film layer 300 may be formed on a desired area without using a mask, the process cost required to use the mask may be reduced. (S102 of FIG. 12)

Figure 13C:
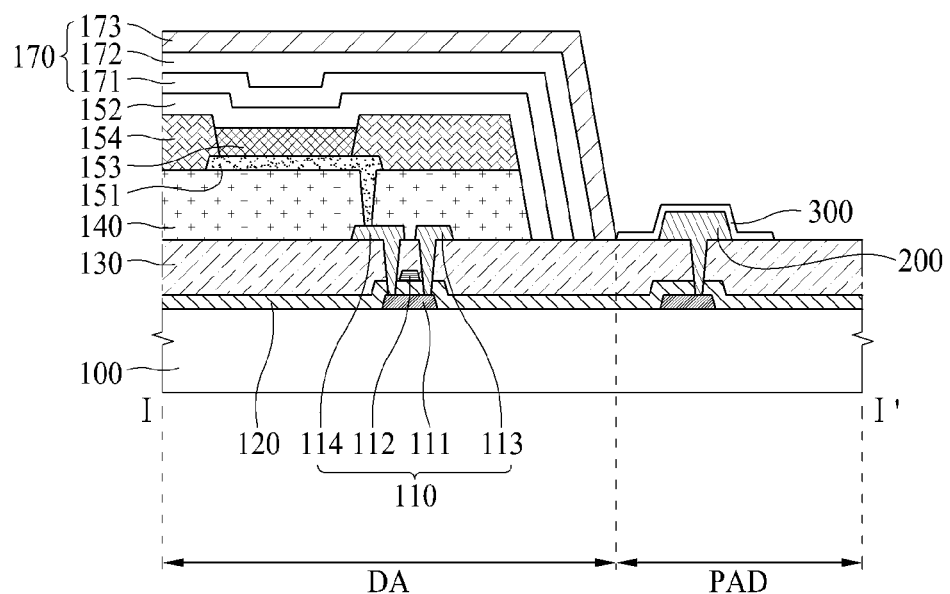

Thirdly, as shown in FIG. 13C, the organic light emitting layer 153 and the cathode electrode 152 are formed. The organic light emitting layers 153 are formed on the anode electrode 151 exposed between the banks 154 on the display area DA. The cathode electrode 152 is formed on the organic light emitting layers 153 and the banks 154 on the display area DA to cover the organic light emitting layers 153 and the banks 154. (S103 of FIG. 12).

Fourthly, as shown in FIG. 13C, the first inorganic film 171, the organic film 172 and the second inorganic film 173 are covered. First of all, the first inorganic film 172 is formed on the cathode electrode 152 of the display area DA and the bank 154 of the non-display area NDA. Afterwards, the organic film 172 is formed on the first inorganic film 171 of the display area DA to prevent water and oxygen from being permeated into the organic light emitting layer 153 and the cathode electrode 152 by passing through the first inorganic film 171. The second inorganic film 173 is formed on the organic film 172. The second inorganic film 173 may cover the first inorganic film 171 and the organic film 172.

A process method for forming the encapsulation layer 170 according to the fabricating method of the display device according to the embodiment of the present invention is atomic layer deposition (ALD). The atomic layer deposition includes spraying a precursor, which may be deposited through a chemical reaction, to be deposited on the display panel 100 in an atomic unit and removing the other precursors, which are not deposited in an atomic unit through a chemical reaction, that is, precursors physically attached onto the display panel, through a purge process. Afterwards, the encapsulation layer 170 may be formed on the display panel 100 in an atomic unit by spraying a reactant. Residual materials which are not deposited in an atomic unit are removed again through a purge process.

Examples of factors that the inorganic protection film or the inorganic-organic composite film is not formed on the anti-film layer 300 even without using a mask may include a material type and thickness of the anti-film layer 300, a pressure that may enable a chemical deposition of a precursor, and a pressure of a purge process for removing materials physically deposited after being reacted with a reactant.

In the conventional inorganic process, exposure obtained by multiplying a pressure which is applied by a time which is applied becomes a reference condition of the process. However, it is noted from the experimental procedure that the factor of the pressure which is applied is more important for the anti-film layer 300 of the display device according to the embodiment of the present invention.

Figure 8:
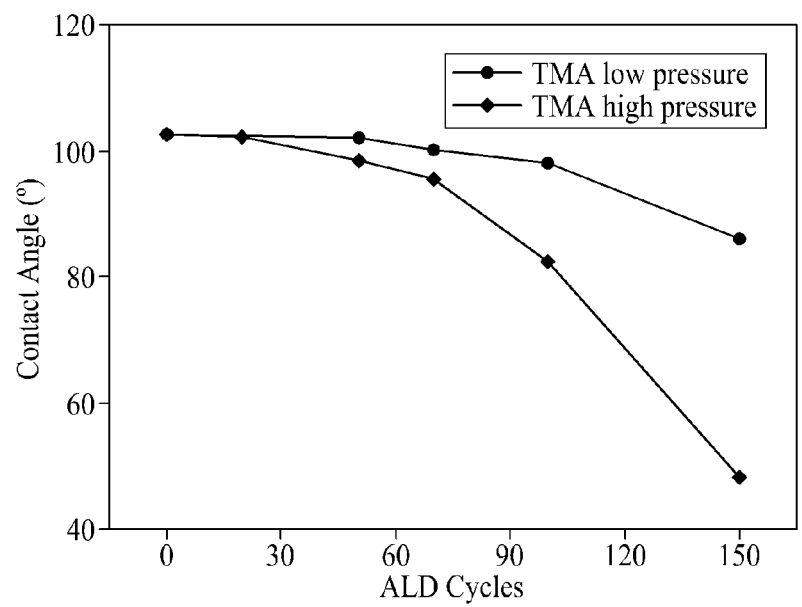
FIGS. 8 to 11 are graphs illustrating an effect based on variables of a fabricating method of a display device according to an embodiment of the present invention.

FIG. 8 is a resultant graph illustrating an anti-film effect measured per pressure of a precursor. A TMA pressure shown in FIG. 8 is the pressure that the precursor is sprayed onto the display panel 100 to form an aluminum oxide inorganic layer. Although the anti-film layer 300 formed on the pads 200 may prevent the precursor from being deposited, if the precursor is deposited at high pressure, the precursor is formed even on the anti-film layer 300, and a reactant is formed on the precursor, whereby a problem occurs in that the encapsulation layer 170 is formed on an area where the encapsulation layer 170 should not be formed. Therefore, it is preferable that the precursor is formed at a pressure that allows the precursor not to be formed on the anti-film layer 300.

Figure 9:
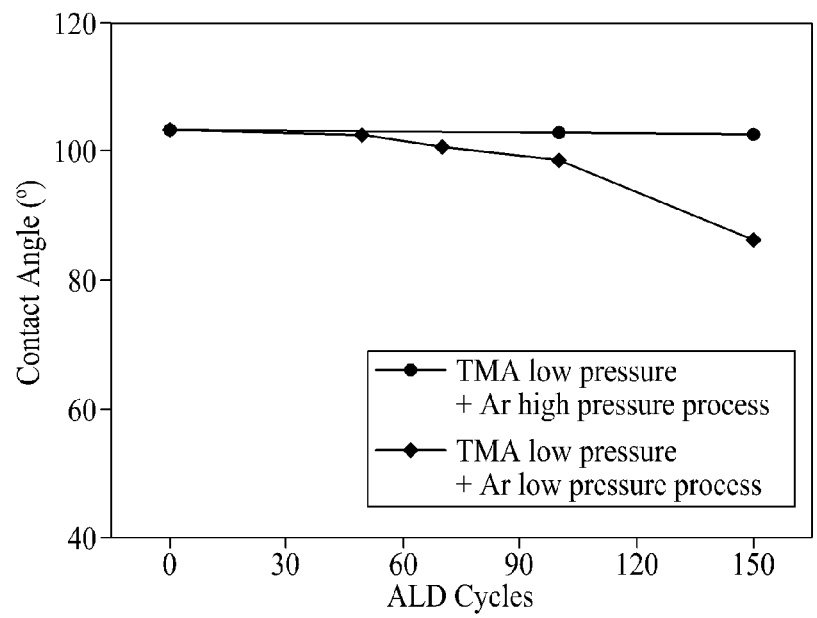
Figure 10:
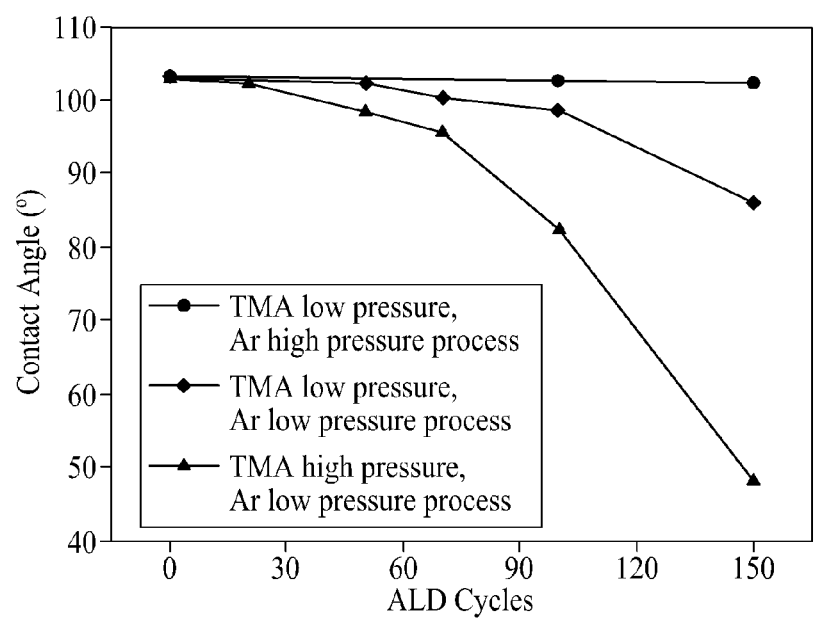
Figure 11:
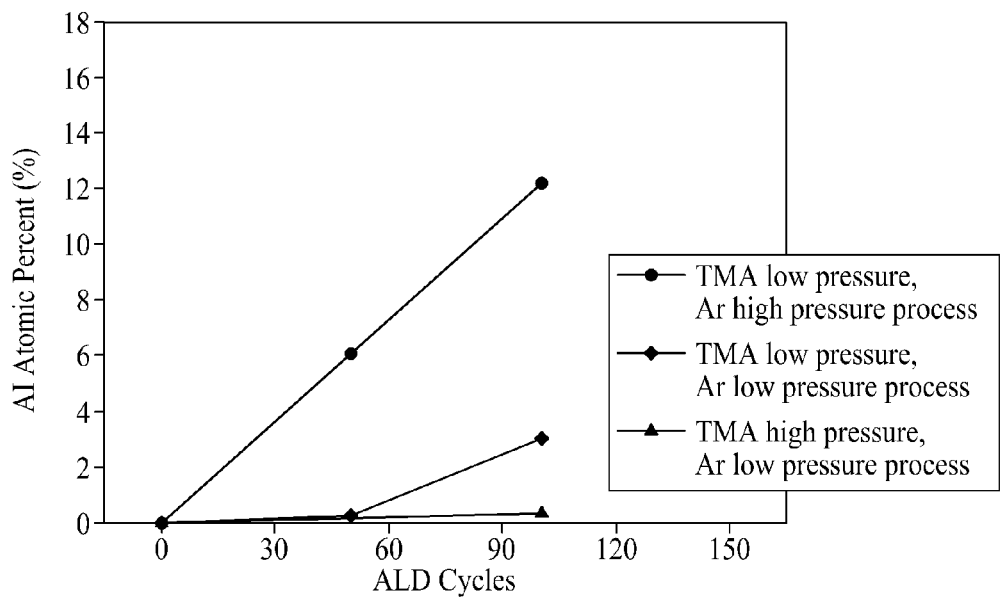
Figure 12:
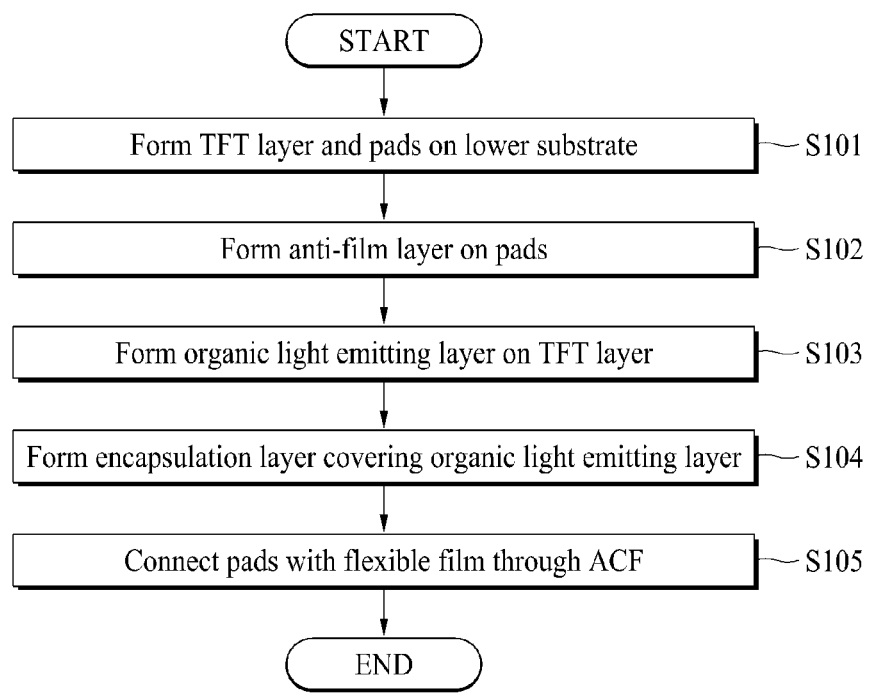
FIG. 12 is a flow chart illustrating a fabricating method of a display device according to an embodiment of the present invention.

FIG. 9 is a resultant graph illustrating an anti-film effect measured per pressure of a purge process for removing materials where deposition is generated. The purge process is performed using an inert gas such as argon (Ar). Residual precursors and reactant may be removed efficiently such that the purge process may be performed at high pressure. FIGS. 10 and 11 are graphs illustrating a pressure when a precursor is formed and anti-film efficiency based on a pressure during a purge process. (S104 of FIG. 12)

Figure 13D:
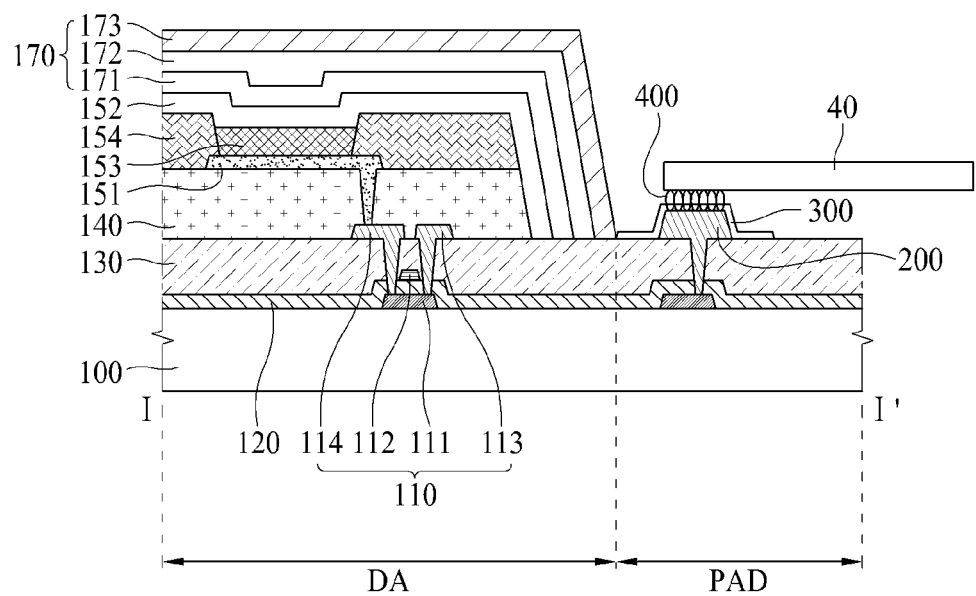

Fifthly, as shown in FIG. 13D, each of the pads 200 is connected with the flexible film 40. The flexible film 40 may be a chip on film (COF). Each of the pads 200 is connected with the flexible film 40 in a state that the anti-film layer 300 is arranged above the pads 200. The anisotropic conductive film ACF 400 is used to electrically connect the flexible film 40 with the each of the pads 200. The anti-film layer 300 remains on the pads 200 in the range of 100 nm or less. Since the conductive balls 401 within the anisotropic conductive film 400 are arranged to partially pass through the anti-film layer 300, the pads 200 may electrically be connected with the flexible film 40 in a state that the anti-film layer 300 is arranged between the pads 200. (S105 of FIG. 12)

As described above, the display device and the fabricating method thereof according to the embodiments of the present invention may obtain the following advantages as follows.

In the display device according to the embodiments of the present invention, since the anti-film layer is formed on the pads, whereby the encapsulation layer is not formed. For this reason, a separate mask for removing the encapsulation layer formed on the pads may not be used. Therefore, the mask cost and the cost for performing a patterning process using a mask may be reduced.

Also, in the display device according to the embodiments of the present invention, the anti-film layer remains on the pads. For this reason, water and oxygen may be prevented from being permeated into the pads during the process.

In the display device according to the embodiments of the present invention, the deposition structure of the first inorganic film, the organic film and the second inorganic film, which are formed at the edge of the display panel, may be neither distorted nor peeled away even though the scribing process is performed, whereby oxygen and water may be prevented from being permeated into the edge of the display panel.

In the fabricating method of the display device according to the embodiments of the present invention, since the anti-film layer is formed on the pads such that the protection layer is not formed for electric connection of the pads, whereby the inorganic film made of aluminum oxide (AlOx) may be prevented from being formed. Therefore, in a semiconductor equipment and the fabricating method of the display device, atomic layer deposition may be performed using aluminum oxide to prevent the inorganic film made of aluminum oxide from being formed.

In the fabricating method of the display device according to the embodiments of the present invention, a pressure is adjusted such that a precursor is not formed on the anti-film layer during an integrated circuit and semiconductor process based on atomic layer deposition. A purge process for removing the precursor or a reactant is performed at a pressure stronger than that applied when the precursor is formed to remove materials which are deposited. Therefore, when the integrated circuit and semiconductor process based on atomic layer deposition is performed, since a mask for preventing the protection layer from being formed for electric connection on the circuit is not required, the process cost may be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

What is claimed is:

1. A display device comprising:
    a lower substrate;
    a thin film transistor arranged on a display area of the lower substrate;
    a planarization film arranged on the thin film transistor;
    a light emitting layer arranged on the planarization film;
    pads arranged on a non-display area of the lower substrate;
    an encapsulation layer arranged on the light emitting layer to cover a side of the planarization film, and including an inorganic protection film or an inorganic-organic composite film; and
    an anti-film layer arranged on the pads to cover a portion of the non-display area from the pads to the encapsulation layer, and to contact the encapsulation layer,
    wherein the anti-film layer prevents the inorganic protection film or the inorganic-organic composite film on the light emitting layer from being formed on the pads, and
    wherein an anti-film material constituting a molecule of the anti-film layer is a self-assembling layer, and includes:
       a head part bonded to a surface of the pads;
       a chain extended from one side of the head part; and
       a tail part connected to an end at one side of the chain.

2. The display device of claim 1, further comprising a gate insulating film arranged below the planarization film and the anti-film layer,
    wherein the anti-film layer contacts the encapsulation layer on the gate insulating film.

3. The display device of claim 1, wherein the light emitting layer includes:
    an anode electrode arranged on the planarization film, and electrically connected with the thin film transistor;
    an organic light emitting layers arranged on the anode electrode; and
    a cathode electrode arranged on the organic light emitting layers, a portion of the cathode electrode contacting the side of the planarization film, and
    wherein the encapsulation layer covers the portion of the cathode electrode contacting the side of the planarization film.

4. The display device of claim 1, wherein the chain is made of a hydrocarbon.

5. The display device of claim 1, wherein the chain is formed of 18 carbon atoms.

6. The display device of claim 1, wherein a thickness of the anti-film layer is based on a length of the chain.

7. The display device of claim 1, wherein the anti-film layer has a thickness of the single molecule.

8. The display device of claim 1, wherein the head part is made of thiol, silane or phosphonic acid, and
    wherein the tail part is made of methyl.

9. A fabricating method of a display device, the fabricating method comprising:
    forming a lower substrate;
    forming a thin film transistor on a display area of the lower substrate;
    forming a planarization film on the thin film transistor;
    forming a light emitting layer on the planarization film;
    forming pads on a non-display area of the lower substrate;

forming an encapsulation layer on the light emitting layer to cover a side of the planarization film, the encapsulation layer including an inorganic protection film or an inorganic-organic composite film; and forming an anti-film layer on the pads, wherein an anti-film material constituting a molecule of the anti-film layer includes:
- a head part bonded to a surface of the pads;
- a chain extended from one side of the head part; and
- a tail part connected to an end at one side of the chain, and wherein the anti-film layer covers a portion of the non-display area from the pads to the encapsulation layer, and contacts the encapsulation layer.

10. The fabricating method of claim 9, wherein the forming the anti-film layer includes:
- dipping an anti-film material on the pads or stamping the anti-film material on the pads; and
- drying the anti-film material.

11. The fabricating method of claim 9, wherein the forming the encapsulation layer forms the encapsulation layer on a display panel on which the anti-film layer is comprised, without a mask,
- wherein the encapsulation layer is not formed on the anti-film layer, and is formed using atomic layer deposition, and
- wherein the atomic layer deposition includes forming an inorganic material at a first pressure, and purging the other inorganic material except an inorganic material deposited in an atomic unit, at a second pressure higher than the first pressure.

12. The fabricating method of claim 9, further comprising connecting each of the pads with a flexible film,
wherein each of the pads is electrically connected with the flexible film through an anisotropic conductive film in a state that the anti-film layer is arranged.

13. The fabricating method of claim 11, wherein the forming the encapsulation layer includes depositing a precursor in an atomic unit at a pressure such that the precursor is not formed on the anti-film layer.

14. The fabricating method of claim 11, wherein the forming the encapsulation layer includes a purge process performed using an inert gas for removing materials where deposition is generated.

15. A display device comprising:
- a lower substrate including a display area and a non-display area;
- a thin film transistor arranged on the display area of the lower substrate;
- a planarization film arranged on the thin film transistor;
- a light emitting layer arranged on the planarization film;
- a plurality of pads arranged on the non-display area of the lower substrate;
- an encapsulation layer arranged on the light emitting layer, and covering a side of the planarization film; and
- an anti-film layer arranged on the plurality of pads, covering a portion of the non-display area from the plurality of pads to the encapsulation layer, and contacting the encapsulation layer, wherein an anti-film material constituting a single molecule of the anti-film layer includes:
- a head part bonded to a surface of the plurality of pads;
- a chain extended from one side of the head part; and
- a tail part connected to an end at one side of the chain, and wherein the anti-film layer has a thickness of the single molecule.

* * * * *